United States Patent [19]

Spies

[11] Patent Number: 5,734,266
[45] Date of Patent: Mar. 31, 1998

[54] TWO PIECE MEASUREMENT REPRESENTATION WITH MAGNETIC ELEMENTS MAGNETIZED WITH THE SAME ORIENTATION

[75] Inventor: Alfons Spies, Seebruck, Germany

[73] Assignee: Dr. Johannes Heidenhain GmbH, Traunreut, Germany

[21] Appl. No.: 563,390

[22] Filed: Nov. 28, 1995

[30] Foreign Application Priority Data

Nov. 29, 1994 [DE] Germany .......... 44 42 371.3

[51] Int. Cl.$^6$ .................................. G01B 7/14
[52] U.S. Cl. .................. 324/207.22; 324/207.25; 324/207.24
[58] Field of Search .............. 324/207.22, 207.23, 324/207.24, 207.25, 252, 174, 163, 166, 151 R; 338/32 H, 32 R

[56] References Cited

U.S. PATENT DOCUMENTS

| | | | |
|---|---|---|---|
| 3,961,214 | 6/1976 | Lokkart | 310/155 |
| 4,274,053 | 6/1981 | Ito et al. | 324/174 |
| 4,361,805 | 11/1982 | Narimatsu et al. | 324/252 |
| 4,462,159 | 7/1984 | Nelle | 250/237 G |
| 4,512,082 | 4/1985 | Burkhardt | 33/706 |
| 4,612,502 | 9/1986 | Spies | 338/32 H |
| 4,645,925 | 2/1987 | Schmitt | 250/237 G |
| 4,654,527 | 3/1987 | Schmitt | 250/237 G |
| 4,725,776 | 2/1988 | Onodera et al. | 324/252 |
| 4,987,415 | 1/1991 | Santos | 341/15 |
| 5,089,817 | 2/1992 | Santos et al. | 341/15 |
| 5,430,374 | 7/1995 | Metz | 324/207.21 |

FOREIGN PATENT DOCUMENTS

| | | | |
|---|---|---|---|
| 0 069 392 | 1/1983 | European Pat. Off. | |
| 1 281 549 | 10/1968 | Germany | |
| 0214219 | 10/1985 | Japan | 324/207.22 |
| 2 016 144 | 9/1979 | United Kingdom | |

Primary Examiner—Sandra L. O'Shea
Assistant Examiner—Jay M. Patidar
Attorney, Agent, or Firm—Brinks Hofer Gilson & Lione

[57] ABSTRACT

A measurement representation with magnetic elements disposed in the measuring direction, comprising fitted-together base bodies, wherein all magnetic elements of each base body are magnetized with the same orientation in one single common direction, and that the fitted-together measurement representation has alternatingly a magnetic element of a base body and of a further base body, wherein the magnetic field of the magnetic elements of the one base body is oriented opposite the magnet field of the magnetic elements of the other base body in the fitted state.

25 Claims, 8 Drawing Sheets

TWO PIECE MEASUREMENT REPRESENTATION WITH MAGNETIC ELEMENTS MAGNETIZED WITH THE SAME ORIENTATION

Applicant claims, under 35 U.S.C. § 119, the benefit of priority of the filing date of Nov. 29, 1994, of a German application, copy attached, Serial Number P 44 42 371.3, filed on the aforementioned date, the entire contents of which are incorporated herein by reference.

FIELD OF THE INVENTION

The invention relates to a measurement representation with magnetic elements disposed in the measuring direction.

BACKGROUND OF THE INVENTION

Measurement representations of this type are employed in particular in connection with position measuring devices in processing machines for measuring the relative position of a tool in respect to a workpiece to be processed, as well as in coordinate measuring machines for determining the position and dimensions of test objects.

A measurement representation is known from European Patent Publication EP-A2 0 069 392, wherein a layer of magnetizable material has been applied to a substrate. Several adjoining magnetic tracks have been inscribed into this layer. Each magnetic track consists of sequential areas of oppositely-oriented magnetization. The periodic flux change is detected by a scanning element sensitive to magnetic fields and position-dependent scanning signals are generated. The magnetization of such a measurement representation is very elaborate.

A further measurement representation is described in German Patent Publication DE-B 1 281 549. The measurement representation consists of a non-magnetic body into which bores for receiving individual bar magnets have been cut. The bar magnets are alternatingly magnetized in opposite direction.

The production of this measurement representation is extremely elaborate, since each bore must be individually cut and the bar magnets must be individually positioned therein.

A measurement representation is known from U.S. Pat. No. 3,961,214, on which this invention is based, which consists of a body with individual magnetic elements. All elements are axially magnetized in the same direction. The magnetic elements are disposed spaced apart in the measuring direction.

It is particularly disadvantageous in connection with this measuring representation that there is no zero-symmetrical magnetic field on its surface.

Thus, is the object of the invention to produce a measurement representation which can be simply and cost-effectively manufactured and whose surface has an at least approximately zero-symmetrical magnetic field.

SUMMARY OF THE INVENTION

The present invention concerns a measurement representation with magnetic elements disposed in the measuring direction, comprising fitted-together base bodies, wherein all magnetic elements of each base body are magnetized with the same orientation in one single common direction, and that the fitted-together measurement representation has alternatingly a magnetic element of a base body and of a further base body, wherein the magnetic field of the magnetic elements of the one base body is oriented opposite the magnet field of the magnetic elements of the other base body in the fitted state.

The advantages which can be achieved by means of the invention consist in particular in that the measurement representation can be produced by means of a simple manufacturing process and that a simple magnetization in particular is made possible.

The invention is described in detail hereinafter, in conjunction with the schematic drawings.

DESCRIPTION OF THE PREFERRED EMBODIMENT

Base bodies 10, 20, 30 will be described below in FIGS. 1 to 3, of which respectively two are combined in accordance with the invention to form an index disk. This combination will be described in greater detail by means of FIGS. 4 and 5.

Figure 1:
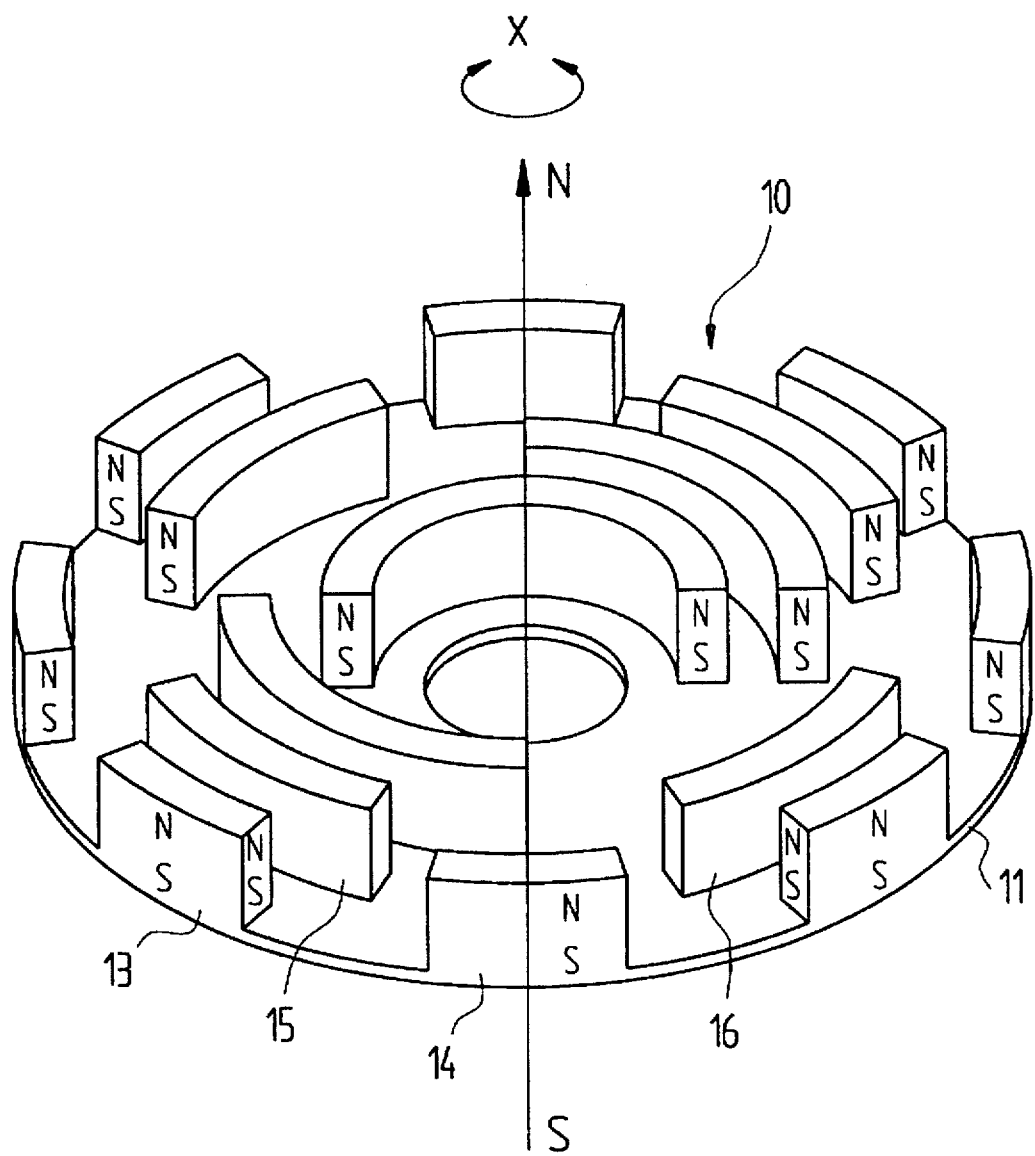
FIG. 1 is a perspective view of an axially magnetizable base body according to the present invention.

The base body 10 of an index disk of an angular measuring device is shown in FIG. 1. The base body 10 consists of a thin, disk-like support 11, on which magnetic elements 13, 14, 15, 16 of a hard magnetic material have been provided, which are spaced apart from each other. The support 11 consists of a non-magnetic or soft magnetic material. The space between the magnetic elements 13, 14 is free of material and therefore non-magnetic. Parallel with the track with the magnetic elements 13, 14 further magnetic elements 15, 16 are provided. In this way the magnetic elements 13, 14, 15, 16 constitute a code for the absolute position determination within one revolution of the base body.

All magnetic elements 13, 14, 15, 16 are axially magnetized in the same direction, as the arrow pointing from S to N is intended to show. The advantage of this construction consists in that all magnet elements 13, 14, 15, 16 of all tracks can be simultaneously artificially magnetized in a homogeneous field without any exact positioning between the base body 10 and the magnetizing device being required. Artificial magnetization of all magnetic elements 13, 14, 15, 16 takes place in a single step particularly advantageously by means of a single coil arrangement.

Figure 2:
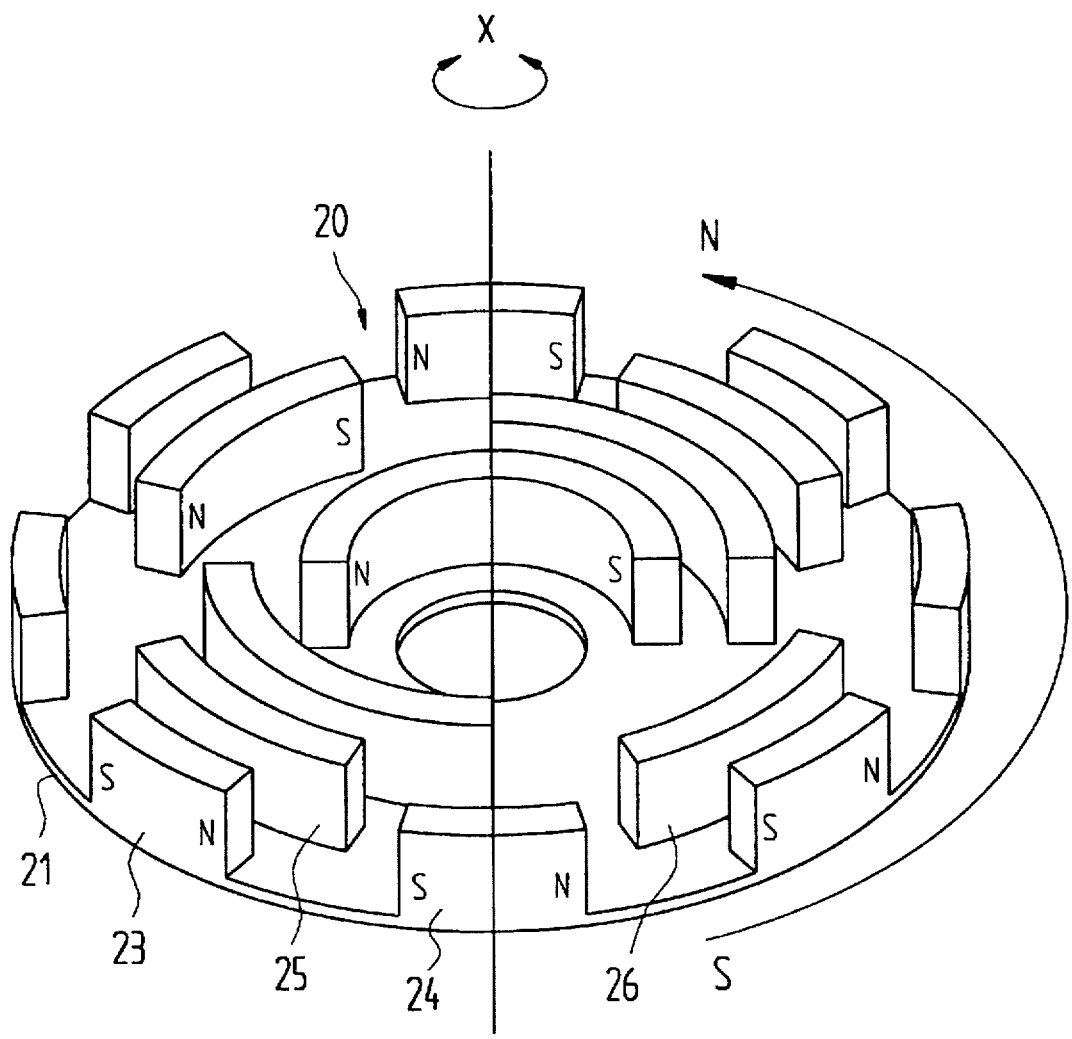
FIG. 2 shows a circularly magnetized base body according to the present invention.
Figure 3:
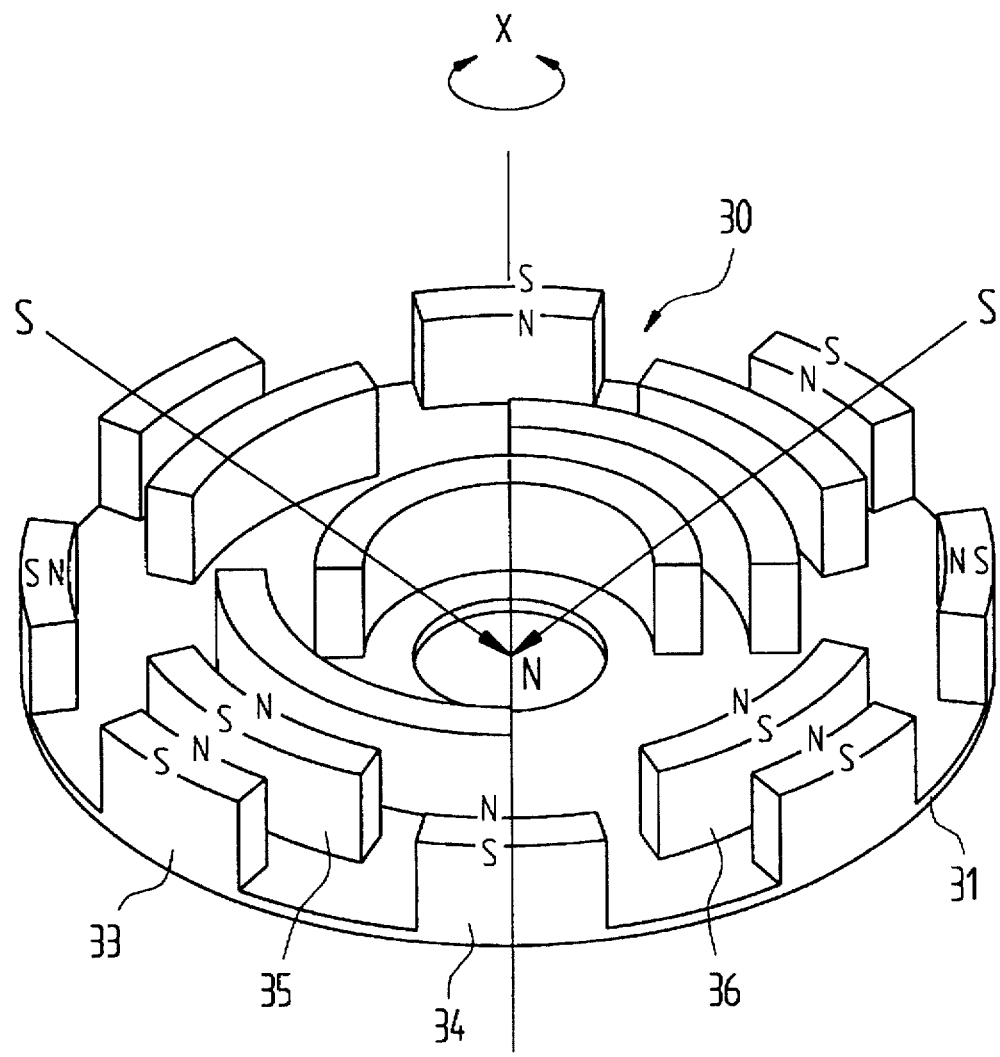
FIG. 3 shows a radially magnetized base body according to the present invention.

Further base bodies 20, 30 are respectively represented in FIGS. 2 and 3. The construction corresponds to the base body 10 in accordance with FIG. 1. The magnetic elements 23 to 26 and 33 to 36 are respectively applied to supports 21 and 31.

In the exemplary embodiment of FIG. 2 all magnetic elements 23, 24, 25, 26 of the base body 20 have been circularly magnetized from S to N parallel with the measuring direction X and point into a common direction.

In a further exemplary embodiment of FIG. 3, all magnetic elements 33, 34, 35, 36 are magnetized radially pointing in a common direction.

The direction of the magnetic field of each magnetic element 13 to 16 and 33 to 36 is oriented perpendicularly in respect to the measuring direction X, while the direction of the magnetic field of each magnetic element 23 to 26 is parallel in respect to the measuring direction X.

The base body 10, 20, 30 is particularly advantageously produced by means of an injection, injection molding, embossing, stamping or sintering process. With the injection molding process, the magnetic elements 13 to 16, 23 to 26 and 33 to 36 consist of permanent magnets embedded in plastic, which makes cost-effective mass production possible. In this case isotropic or anisotropic production is possible. Isotropic here means that after injection the elementary magnets are in a disorganized state. No exterior magnetic field is applied during the injection process. Magnetizing of the magnetic elements 13 to 16, 23 to 26, 33 to 36 takes place only after the injection molding process has been terminated. With the anisotropic method an exterior magnetic filed is applied during the injection process, because of which the elementary magnets are oriented from the start. The magnetic properties which can be obtained with this are considerably improved over the isotropic production, because with this effect the preferred magnetic axes of the ferrite particles easily align themselves parallel with the desired direction of orientation.

Permanent magnets or coils are used for producing exterior or interior magnetic field for artificial magnetizing.

As shown in FIGS. 1–3, a number of magnetic elements are positioned at different radial distances from an axis of symmetry or rotational axis NS. In addition, the magnetic elements are semi-annular in shape relative to the axis NS. In addition, the angle circumscribed by a magnetic element will increase the nearer that magnetic element approaches axis NS.

In the exemplary embodiments of FIGS. 1 to 3, the magnetic elements 13 to 16, 23 to 26, 33 to 36 have been attached to the non-magnetic support 11, 21, 31 by injection. If plastic is also selected for the support 11, 21, 31, the base body 10, 20, 30 can also be produced by the two-component injection process in that two different materials are injected into one mold.

Production by means of the injection molding process has the particular advantage that functional elements in the form of hubs, shafts or gear wheels can be directly produced by being molded in one piece to the base body, or that such functional elements can be injected or pressed in or inserted.

Figure 4:
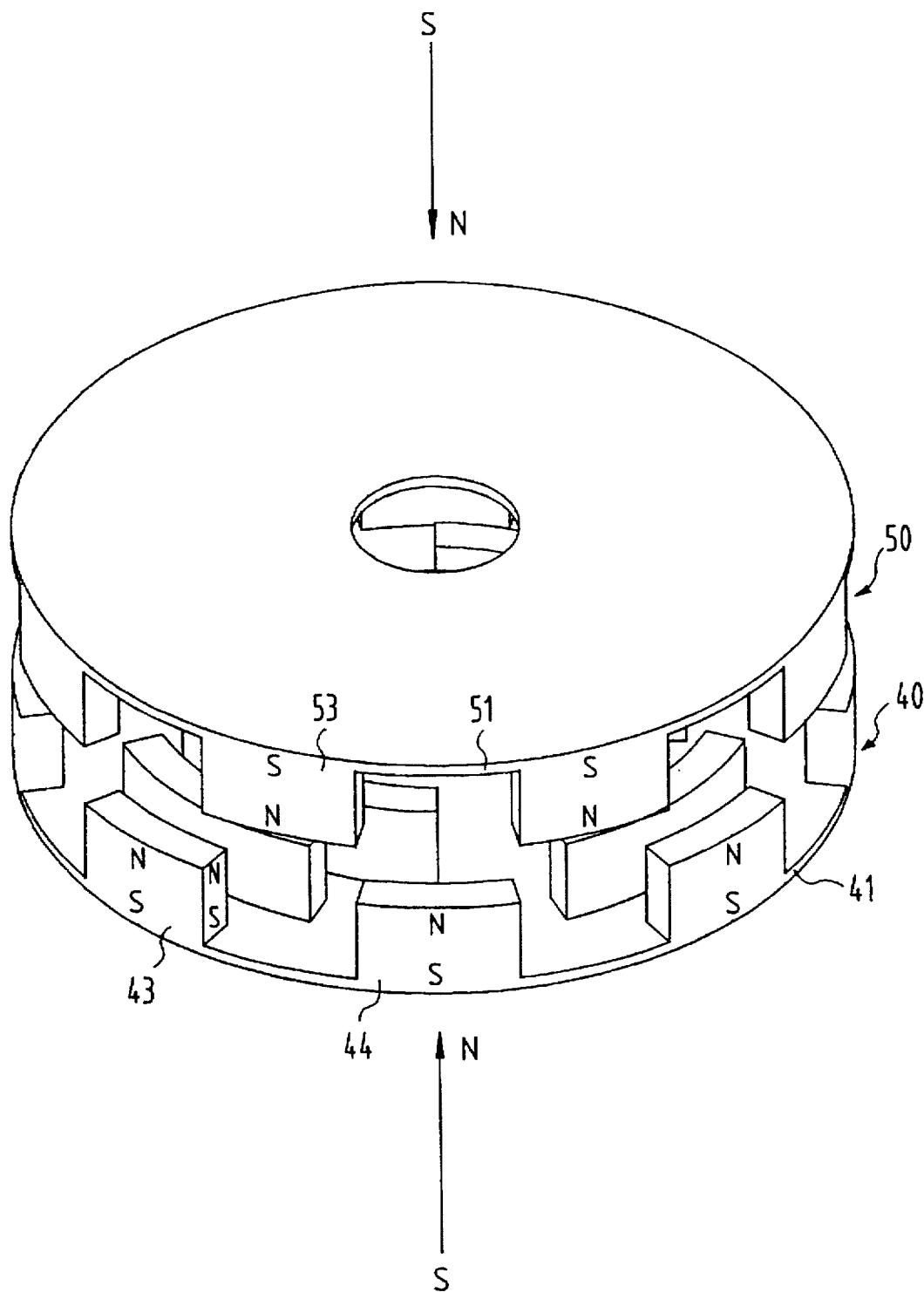
FIG. 4 is a perspective view of an axially magnetized index disk consisting of two parts according to the present invention.

The production of the base body 10, 20, 30 is simplified if the support consists of the same hard magnetic material as the magnetic elements. Only one single material is injected into the mold during the injection molding process. Two such base bodies 40, 50 are represented in FIG. 4. Since the support 41, 51 is thin in comparison with the height of the magnetic elements 43, 44, 53, there is only a negligible effect on the magnetic filed emanating from the magnetic elements 43, 44, 53.

Figure 7:
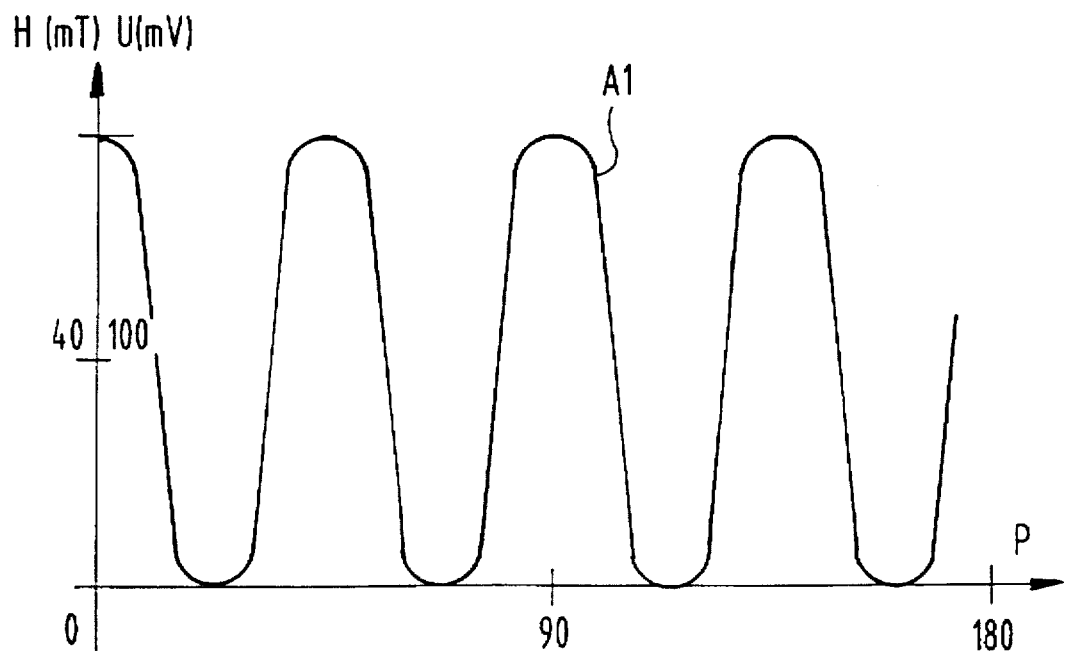
FIG. 7 represents a signal diagram which is created in the course of scanning the base body of FIG. 1.

If one of the base bodies 10, 20, 30, 40, 50 is scanned by a magnetically sensitive scanning element, 200 for example a Hall element, in that the base body 10, 20, 30, 40, 50 moves in the measuring direction X in respect to the stationary Hall element, the Hall element will provide a position-dependent scanning signal A1 as represented in FIG. 7. A binary signal is formed in a known manner by triggering this analog scanning signal A1. Because the magnetic field on the surface of a base body 10, 20, 30, 40, 50 is not zero-symmetrical, the scanning signal A1 is also not zero-symmetrical.

Figure 8:
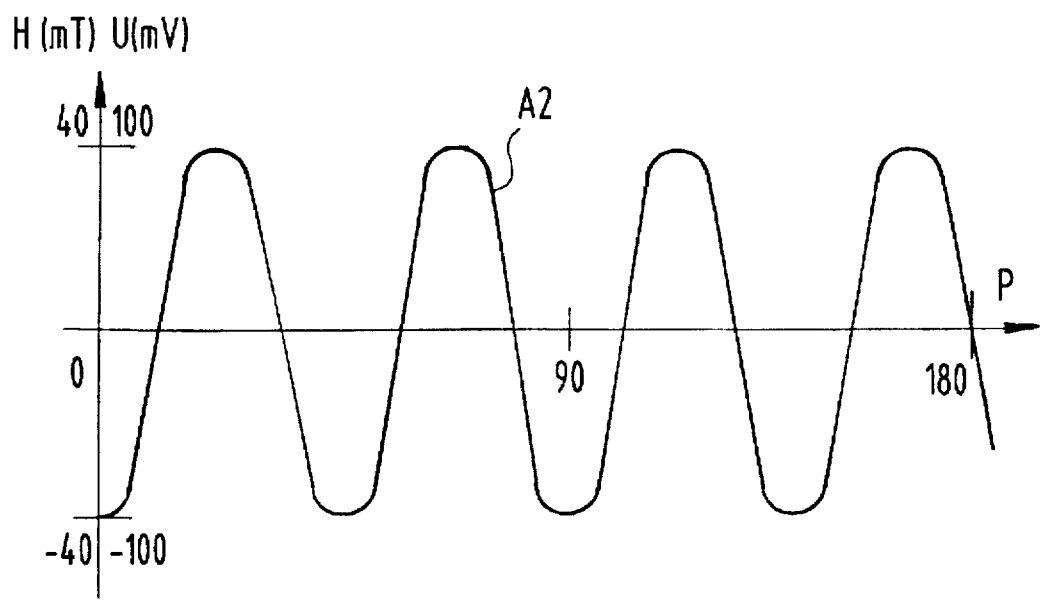
FIG. 8 represents a signal diagram which is created in the course of scanning the index disk of FIG. 4.

In the signal diagrams in FIGS. 7 and 8, the magnetic field strength which is depending on the position P in degrees is indicated by mT at the position of the Hall element and the signal voltage U which is applied to the Hall element proportionally with it is indicated by mV.

It is advantageous for forming the binary signal if the analog scanning signal A2 is zero-symmetrical, as shown in FIG. 8. This scanning signal A2 is obtained by scanning the index disks embodied in accordance with the invention and represented in FIGS. 4 to 6.

Figure 6:
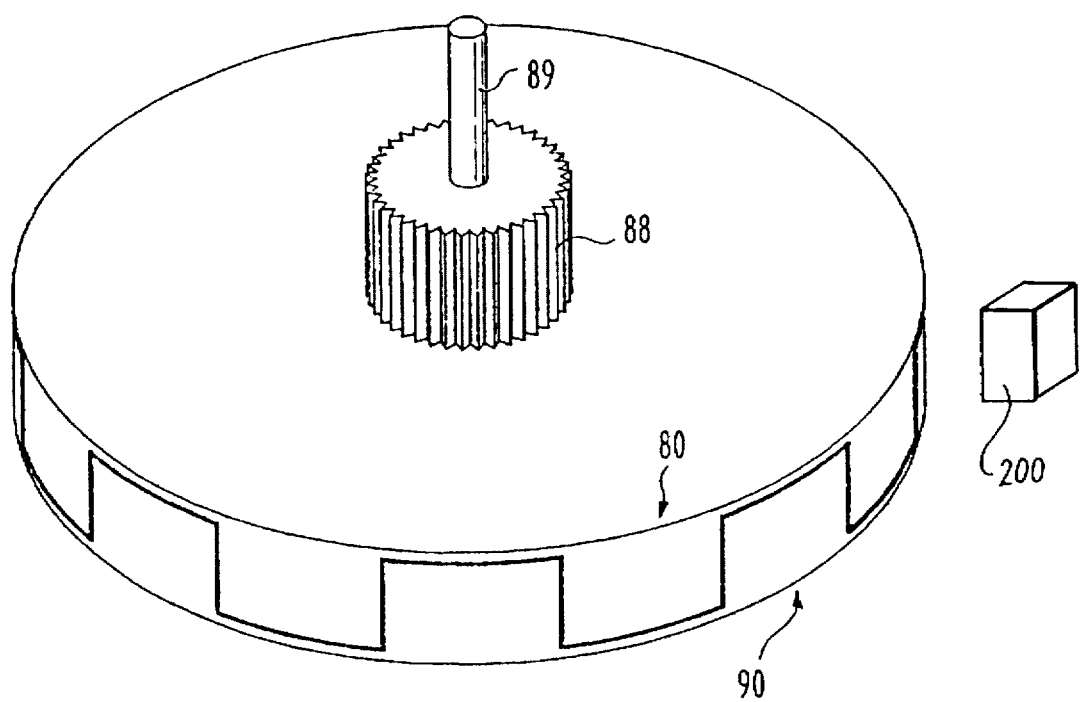
FIG. 6 shows an index disk with function elements according to the present invention.

The index disk in FIG. 4 consists of two identical base bodies 40, 50, which have already been described. Two base bodies 10, 20, 30 in accordance with FIGS. 1, 2 or 3 can be used. The two base bodies 40, 50 are put together in such a way that a raised magnetic element 53 of the upper base body 50 exactly fits into the space between two magnetic elements 43 and 44 of the lower base body 40, which are spaced apart in the measuring direction X. FIG. 4 shows the status of fitting together, while two base bodies 80, 90 which have already been fitted together to form an index disk are shown in FIG. 6. Since the two base bodies 40, 50 had been magnetized in the same direction during manufacture and one base body 50 was mined by 180° when they were fitted together, the result is magnetization of the magnetic elements 53 in the opposite direction to that of the magnetic elements 43 and 44. An index disk is obtained by this step which has alternatingly oppositely directed magnetized areas in the form of magnetic elements 43, 53, 44. To obtain an easily manipulated index disk, the two base bodies 40, 50 are glued together.

Scanning of the index disk is preferably performed by means of a scanning element which is placed opposite the free surface of the support 41 and 51. If the supports 41 and 51 are made of a non-magnetic or not magnetized material, a zero-symmetrical magnetic alternating field in the measuring direction X is present at this location. The zero symmetry is slightly interfered with if the supports 41, 51 are also magnetized. To obtain a zero-symmetrical field in this case, too, an opposing field can be applied after the two base bodies 40, 50 have been fitted together and magnetization can be changed in such a way that the interfering field is compensated.

A further possibility would be to remove the supports 41, 51 after they have been glued together, for example by milling or grinding them off, so that only the magnetic elements 43, 53, 44 remain.

A particularly advantageous possibility to obtain a zero-symmetrical alternating field in the measuring direction X consists in demagnetizing the thin webs of the supports 41, 51. A small opposite field is sufficient to demagnetize the thin webs. The magnetization of the magnetic elements 43, 53, 44 is only slightly weakened in the process.

It is also possible to obtain a zero-symmetrical alternating field at the location of the scanning element if the base body 40 located opposite the scanning element is more weakly magnetized than the base body 50, which is disposed farther removed from the scanning element. A further possibility would be to embody the two base bodies 40, 50 geometrically different.

Figure 5:
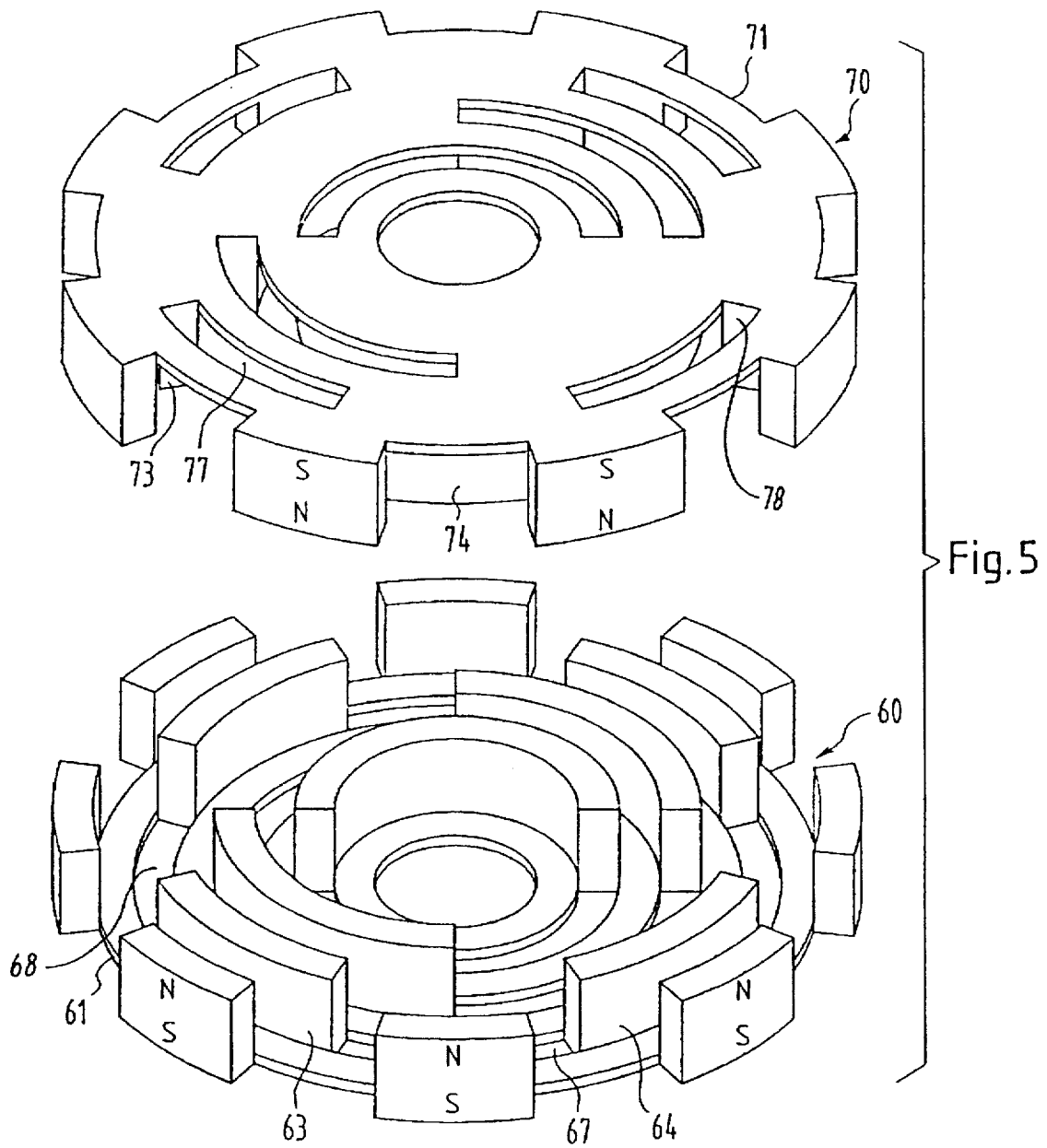
FIG. 5 shows a second embodiment of a two-part index disk according to the present invention.

An index disk consisting of two base bodies 60, 70 is represented in FIG. 5 in the process of being fitted together. Magnetization has been performed in correspondence with the already explained examples. To generate a zero-symmetrical magnetic field on the two level surfaces of the index disk, continuous recesses 67, 68 and 77, 78 are provided in the supports 61 and 71 of base bodies 60 and 70, which are respectively exactly engaged by the raised end areas of the magnetic elements 73, 74 and 63, 64 of the other base body 70 or 60.

FIG. 6 shows an index disk made of two base bodies 80, 90, fitted together in accordance with the invention. The base bodies 80, 90 are two form parts made of permanent magnets embedded in plastic in accordance with the injection molding process. A gear wheel 88 has been attached by injection to the base body 80, and a steel shaft 89 has been inserted. Such functional elements can be injected or pressed or inserted in one or even both base bodies.

Incremental or absolute angle measuring systems, in particular multi-turn shaft encoders, wherein several index disks of the same type are driven by reduction gears and wherein by means of this the absolute position of a drive shaft can be measured over several revolutions, are a field of use for index disks designed in accordance with the invention. An index disk designed in accordance with the invention can also be used in connection with anti-locking systems.

Figure 9:
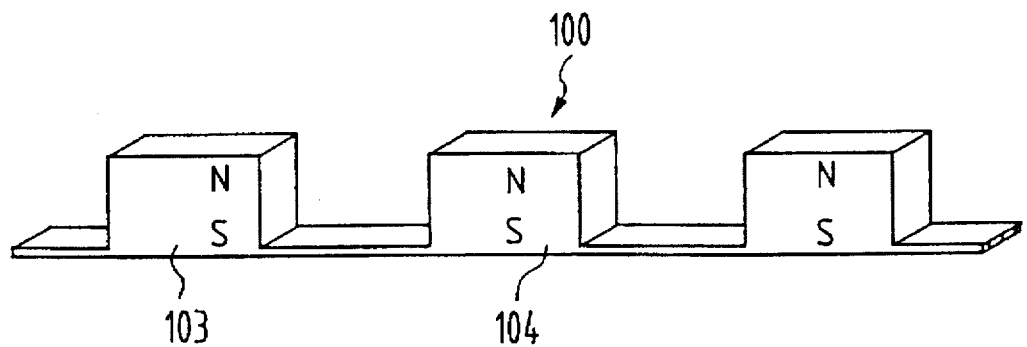
FIG. 9 shows a linear base body according to the present invention.
Figure 10:
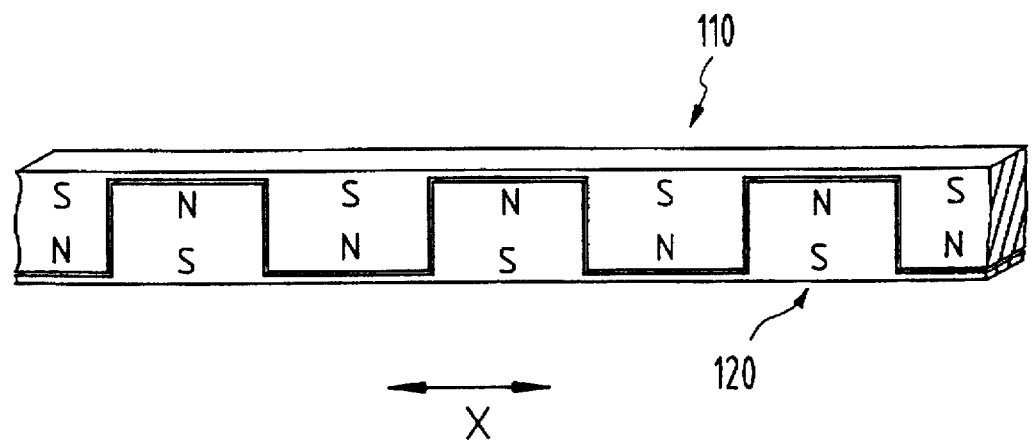
FIG. 10 represents a two-part linear measurement representation according to the present invention.

The invention can also be employed in linear measurement representations which are used in linear measuring systems. An example of this is represented in FIG. 10. In accordance with FIG. 9, a linear base body 100 consists of magnetic elements 103 and 104, which are spaced apart and are magnetized in the same orientation in a common direction.

A linear scale embodied in accordance with the invention is represented in FIG. 10, which consists of two magnetized base bodies 110, 120, which are formed and magnetized the same. Here, too, magnetization of the magnetic elements can be in the measuring direction X or perpendicularly thereto. Otherwise, the same measures as described in connection with the index disks in accordance with FIGS. 1 to 6 can be used with the linear scales.

The measurement representation can have magnetic elements in one or several tracks and can be embodied to be incremental or coded, wherein coding in a single track is also possible in the form of a so-called chain code.

The magnetic elements of the embodiments shown are structured to be rectangularly stepped, however, they can also be structured sinusoidal or triangular.

It is particularly advantageous if the measurement representation only consists of two base bodies 40, 50, 60, 70, 80, 90, 110, 120. However, it is also within the scope of the invention for the measurement representation to consist of more than two interlocking base bodies. For example, in case of multi-track measurement representation, such as represented in FIGS. 4 to 6, each track can consist of two base bodies. This would mean eight base bodies in the four tracks shown, which form a measurement representation after having been fitted together in accordance with the invention. Also, in connection with large or long measurement representations more than two base bodies, related to the entire measuring length, can be used to form a measurement representation.

The invention may be embodied in other forms than those specifically disclosed herein without departing from its spirit or essential characteristics. The described embodiments are to be considered in all respects only as illustrative and not restrictive, and the scope of the invention is commensurate with the appended claims rather than the foregoing description.

I claim:

1. A measurement representation with magnetic elements disposed along a measuring direction (X) on first and second base bodies, comprising fitted-together said first and second base bodies, wherein all said magnetic elements of said first base body are magnetized with the same orientation in one single common direction, and that the fitted-together measurement representation comprises a plurality of magnetic elements wherein a magnetic element of said first base body is positioned between a pair of magnetic elements of said second base body, wherein the orientation of the magnetic field of said magnetic elements of said first base body differs from the orientation of the magnetic field of said magnetic elements of the said second base body.

2. The measurement representation of claim 1, wherein said first and second base bodies each have at least approximately the same dimensions and that, when said first and second base bodies are fitted together, said first base body comprises raised magnetic elements engage gaps formed between raised magnetic elements of said second base body.

3. The measurement representation of claim 1, wherein said first and second base bodies are fitted together by gluing.

4. The measurement representation of claim 1, wherein said magnetic elements of said first and second base bodies are disposed along said measuring direction (X) so as to form an at least approximately zero-symmetrical alternating field on a surface of said measurement representation.

5. The measurement representation of claim 4, wherein said magnetic elements of said first base body are provided on a support with continuous recesses, wherein said magnetic elements of said second base body engage said continuous recesses by being inserted therein.

6. The measurement representation of claim 4, wherein said magnetic elements of said first base body are disposed on a support of a hard magnetic material, wherein said support comprises demagnitized thin webs located between said magnetic elements of said first base body.

7. The measurement representation of claim 1, wherein said magnetic elements of said first base body are magnetized parallel with said measuring direction (X) or perpendicularly with respect to said measuring direction (X), and wherein said magnetic elements of said first base body are raised.

8. The measurement representation of claim 1, wherein said magnetic elements of said first base body are structured to be rectangular, sinusoidal or triangular.

9. The measurement representation of claim 1, wherein said magnetic elements of said first base body are raised on a soft magnetic or non-magnetic support.

10. The measurement representation of claim 1, wherein said magnetic elements of said first base body are raised on a support, wherein said magnetic elements of said first base body and said support each are comprised of the same material and comprise a one-piece formed part.

11. The measurement representation of claim 9, wherein said magnetic elements of said first base body comprise a hard magnetic material embedded in plastic.

12. The measurement representation of claim 10, wherein said magnetic elements of said first base body comprise a hard magnetic material embedded in plastic.

13. The measurement representation of claim 1, wherein said magnetic elements, which are disposed along said measuring direction (X), are provided in several individual tracks, wherein said magnetic elements of said individual tracks are disposed spaced apart from each other, viewed perpendicularly to said measuring direction (X).

14. The measurement representation of claim 1, comprising an index disk for an angular measuring device, wherein said magnetic elements are radially or axially or circularly magnetized.

15. The measurement representation of claim 1, wherein said first base body is a one-piece formed part on which at least one functional element is formed.

16. The measurement representation of claim 1, comprising a functional element that is injected or pressed or inserted in said first base body.

17. The measurement representation of claim 15, wherein said functional element is a shaft, a hub or a gear wheel.

18. The measurement representation of claim 17, wherein said functional element is a shaft, a hub or a gear wheel.

19. The measurement representation of claim 1, wherein said magnetic elements of said first and second base bodies are artificially magnetized.

20. The measurement representation of claim 1, wherein said first and second base bodies are produced by means of an injection, injection molding, embossing, stamping or sintering process.

21. The measurement representation of claim 1 wherein all magnetic elements of said second base body are magnetized with the same orientation in one single common direction.

22. The measurement representation of claim 1 wherein the magnetic field of said magnetic elements of said first base body is oriented opposite the magnetic field of said magnetic elements of said second base body.

23. A method for producing a measurement representation with magnetic elements disposed along a measuring direction (X) on first and second base bodies, said method comprising the steps of:

providing said first base body with magnetic elements, wherein all magnetic elements of said first base body are magnetized with the same orientation in one single common direction; and fitting said second base body together with said first base body so as to form an assembled measurement representation, wherein said assembled measurement representation comprises a plurality of magnetic elements wherein a magnetic element of said first base body is positioned between a pair of magnetic elements of said second base body, and wherein the magnetic field of said magnetic elements of said first base body differs from the orientation of the magnetic field of said magnetic elements of the said second base body.

24. The method of claim 23, comprising the step of artificially magnetizing all magnetic elements of said first base body.

25. A position measuring device comprising:

a measurement representation with magnetic elements disposed along a measuring direction (X), wherein said measurement representation comprises first and second base bodies, wherein all magnetic elements of said first base body are magnetized with the same orientation in one single common direction, and said measurement representation further comprises a plurality of magnetic elements wherein a magnetic element or said first base body is positioned between a pair of magnetic elements of said second base body, wherein the orientation of the magnetic field of said magnetic elements of said first base body differs from the orientation of the magnetic field of said magnetic elements of the said second base body; and a scanning element which is sensitive to magnetic fields and generates a position dependent scanning signal when scanning said magnetic elements.

* * * * *

UNITED STATES PATENT AND TRADEMARK OFFICE
CERTIFICATE OF CORRECTION

PATENT NO. : 5,734,266
DATED : March 31, 1998
INVENTOR(S) : Alfons Spies

It is certified that error appears in the above-identified patent and that said Letters Patent is hereby corrected as shown below:

In claim 8, line 1, change "1" to --7--.

In claim 18, line 1, change "17" to --16--.

In claim 25, line 9, change "element or" to --element of--.

Signed and Sealed this

Second Day of May, 2000

Attest:

Attesting Officer

Q. TODD DICKINSON
Director of Patents and Trademarks